United States Patent
Meth

(10) Patent No.: US 7,163,835 B2
(45) Date of Patent: Jan. 16, 2007

(54) METHOD FOR PRODUCING THIN SEMICONDUCTOR FILMS BY DEPOSITION FROM SOLUTION

(75) Inventor: Jeffrey Scott Meth, Landenburg, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 38 days.

(21) Appl. No.: 10/949,604

(22) Filed: Sep. 24, 2004

(65) Prior Publication Data

US 2006/0024960 A1 Feb. 2, 2006

Related U.S. Application Data

(60) Provisional application No. 60/506,687, filed on Sep. 26, 2003.

(51) Int. Cl.
  *H01L 21/00* (2006.01)
(52) U.S. Cl. ............... 438/86; 438/650; 205/126; 427/443.1
(58) Field of Classification Search .......... 438/86, 438/678, 650; 205/126, 163, 167; 427/74, 427/226, 443.1, 442.2
See application file for complete search history.

(56) References Cited

U.S. PATENT DOCUMENTS 3,367,792 A  2/1968  Levine 6,023,020 A * 2/2000 Nishitani et al. ........... 136/255
6,169,246 B1 * 1/2001 Wu et al. .................... 136/265
2005/0130443 A1 * 6/2005 Meth et al. ................. 438/780

FOREIGN PATENT DOCUMENTS

WO    WO 00/29646 A    5/2000

OTHER PUBLICATIONS

High efficiency CdS/CdTe solar cells from solution-grown CdS films Chu et al., Photovoltaic Specialists Conference, 1991., Conference Record of the Twenty Second IEEE Oct. 7-11, 1991 Page(s):952-956.*
Chemical Surface Depostion of Ultra-Thin Cadmium Sulfide Films for High Performance and High Cadmium Utilization McCandless et al. 3rd Wold Conference on Photovoltaic Energy Conversion, 2003. pp 562-565.*
Patent Abstracts of Japan, Apr. 4, 1986, vol. 010, No. 085 & JP 80 218475 A (Nippon Denki KK), Nov. 1, 1985 abstract.
P. K. Nair, J. Campos and M. T S. Nair, "Opto-electronic Characteristics of Chemically Deposited Cadmium Sulphide Thin Films," Semiconductor Science and Technology Institute of Physics, London, GB, 1998, pp. 124-145 vol. 3, XP002959149 ISSN: 0268-1242.
H. Metin and R. Esen, Journal of Crystal Grownth, Online Aug., 2003, pp. 141-148, vol. 258, XP 002324135.

* cited by examiner

*Primary Examiner*—George R. Fourson
*Assistant Examiner*—John M. Parker

(57) ABSTRACT

A method is described for producing thin semiconductor films on a substrate by contacting a substrate with a solution containing a metal salt, a source of a Group VIa element, and chelating agent, and a noble metal in its elemental form. The resulting semiconductor films are useful for electronic and photovoltaic applications.

11 Claims, 1 Drawing Sheet

METHOD FOR PRODUCING THIN SEMICONDUCTOR FILMS BY DEPOSITION FROM SOLUTION

FIELD OF THE INVENTION

Figure 1:
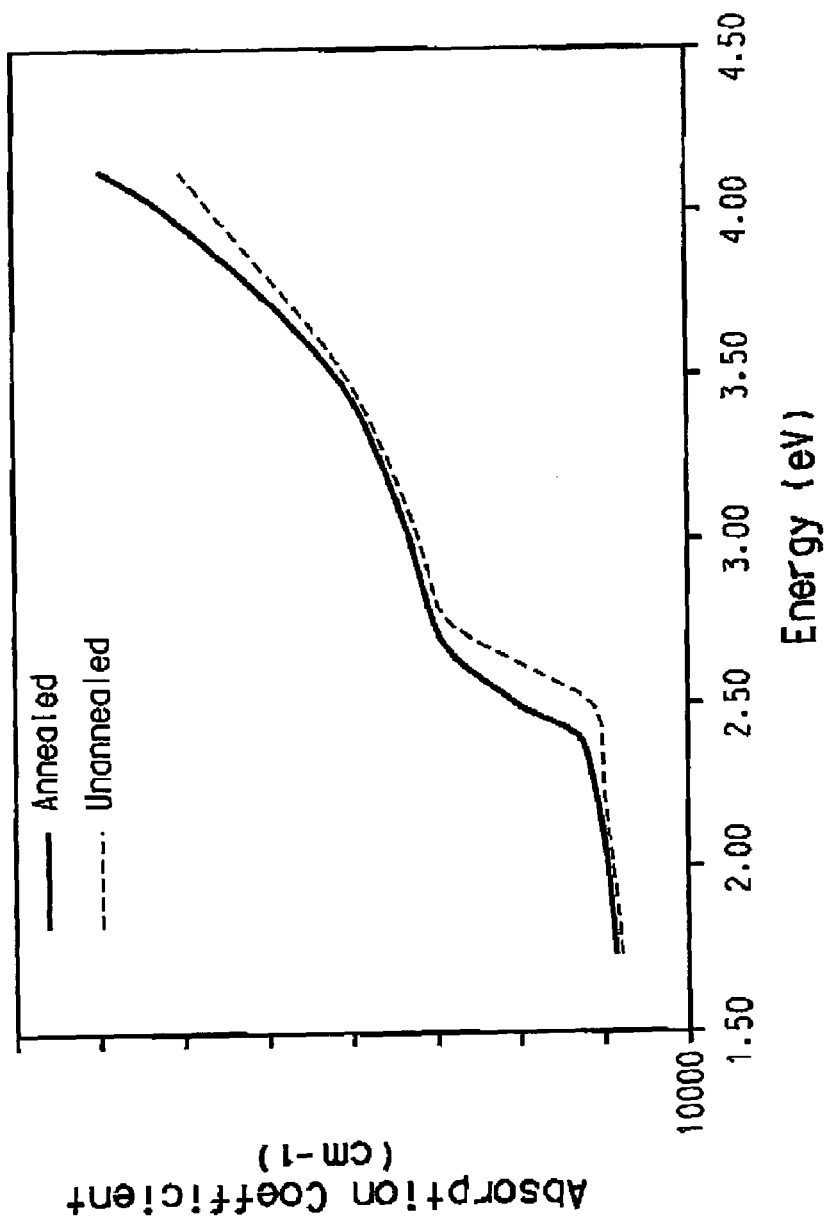

This invention relates to methods for producing cadmium sulfide semiconductor films from solution.

TECHNICAL BACKGROUND OF THE INVENTION

Thin films of semiconductors are useful for many technological applications. In particular, semiconductors consisting of a cation with valence II and an anion of valence VI, which are often referred to as II-VI compounds, have been shown to be useful as the active materials in transistors and photovoltaic devices. These semiconductors were initially produced by vacuum techniques such as evaporation or sputtering. As the art progressed, it was discovered that these materials could be grown directly from a precursor solution. This process was termed chemical bath deposition (CBD).

The properties of the semiconductors produced by CBD are highly dependent upon the bath composition and temperature, the substrates upon which the films are grown, and any post-treatments applied to the films. Reducing variability is important for producing commercially viable devices. Therefore, it would be desirable to discover methods that improve the properties of chemically deposited films.

SUMMARY OF THE INVENTION

This invention provides a process for depositing a semiconductor film on a substrate, comprising:
(a) heating deionized water and the substrate in the presence of a noble metal in its elemental form;
(b) adding sequentially an aqueous solution comprising a metal salt; a chelating agent; and an aqueous solution of source of a group Via element; and
(c) allowing a film to form on the substrate.

FIGURE

FIG. 1 shows the absorption coefficient vs. energy for CdS films, (averaged over the 8 samples) made from cadmium formate, thiourea and EDA.

DETAILED DESCRIPTION OF THE INVENTION

It is known, for example, that aqueous solutions of cadmium salts and thiourea can react to form precipitates of CdS. Most commonly, the precipitate is in the form of a bulk precipitate that is not at all useful for making thin films of CdS.

This invention provides a process for depositing a thin film of a semiconductor on a substrate via chemical bath deposition. The process of this invention favors the formation of surface precipitates that can form a conformal film on a substrate, thus providing a cheaper and more convenient alternative to vacuum deposition processes.

The process of this invention comprises pre-treating the substrate by heating it in deionized water in the presence of a noble metal in its elemental form, adding an aqueous solution of a metal salt, a chelating agent, and a source of a group VIa element, and allowing a semiconductor layer to form on the immersed substrate.

An optional annealing step can be carried out after removing the substrate from the bath. Annealing at about 250° C. improves the mobility by about 10×, but can only be performed if the substrate is thermally stable at that temperature.

Suitable metal salts include water-soluble formate, acetate, sulfate and chloride salts of Cd, Hg, Ag, Mn, Bi, Sb, As Sn, In, Pb, Cu, Co, Ni, Mo, Fe, and Cr. Cadmium is a preferred metal. Cadmium formate and cadmium acetate salts are especially preferred.

Suitable Group VIa elements include O, S and Se. Suitable sources of these elements include water (for making metal oxides); thiourea, thioacetamide and $Na_2S_2O_3$ (for making metal sulfides); and selenourea, dimethylselenourea and $Na_2Se_2O_3$ (for making metal selenides).

Suitable complexing agents include, but are not limited to, ammonia, ethylenediamine (EDA), diethanolamine (DEA), triethanolamine (TEA), pyridine, aniline, and aminophenols. Ethylenediamine and triethanolamine are preferred. It has been found that in the case of CdS, the use of EDA produces thicker films than TEA; TEA has a shorter induction time.

For metal sulfides and selenides, the molar ratios are not critical, but preferably the ratio of metal salt to S or Se source is about 1:1, and the ratio of metal salt to chelating agent is preferably about 1:1 to 1:100.

Suitable substrates include glass, fused silica, spin-coated polyimide, polycarbonate, polyester, and silicon wafers.

By using a noble metal in its elemental form in the chemical bath deposition process, as described in this invention, the electrical properties of the resulting semiconducting film are improved. The semiconductor has lower levels of impurities in it, which results in lower conductivity. Useful noble metals include gold, platinum, palladium, silver, nickel, and copper.

The products of this invention (i.e., a substrate coated with a thin film of a semiconductor) are useful in the construction of electronic devices, such as photovoltaic cells and thin film transistors.

EXAMPLES

The thickness of the CdS films was measured on a Tencor stylus profilometer. Wiping the film with a swab dipped in 2 M $NaHSO_4$ creates an edge, since CdS dissolves in acid.

All reagents were purchased from Sigma Aldrich

Optical spectra of the films were taken in the UV-Vis range to measure the resulting band gap. This, coupled with the thickness measurements, allows one to calculate the absorption coefficient for the CdS films.

To characterize the electrical conductivity of the films, aluminum source/drain electrodes were evaporated onto the film. The electrode width was 500 μm and the channel length was 20, 50 or 100 μm. Aluminum is known to make Ohmic contact to CdS, so a two-probe conductivity measurement is sufficient. The I-V curve was typically measured from −1 to +1 V, and was fitted to a straight line.

These examples describe the preparation of CdS films and their resulting conductivity depending on whether or not gold foil was included in the bath.

Comparative Example 1

A stock solution of thiourea was made by taking 2.444 gms of thiourea (Sigma Aldrich, 99%) and adding deionized water until the total weight was 100 gms. A stock solution of cadmium acetate (Sigma Aldrich, 99%) was made by taking 5.032 gms and adding deionized water until the total weight was 100 gms.

Deionized water (237.346 gms) that had been heated to 70° C. was added to a Teflon PFA beaker. Two fused silica slides measuring 1"×2" (Heraeus Amersil) were cleaned by washing with acetone, methanol, and deionized water, then dried in a nitrogen stream. They were then cleaned in a plasma oven (Plasmapreen 973, North Brunswick, N.J.) at 300 W for 5 minutes. The slides were then placed into the Teflon PFA beaker. Triethanolamine (1.119 gms, Sigma Aldrich 99%) was added to the beaker, followed by 6.871 gms of the cadmium acetate stock solution, and then 4.664 gms of the thiourea stock solution. The solutions were filtered through a Millipore filter as they were added, and the bath was stirred continuously. The resulting solution was 30 mM in triethanolamine, 6 mM in thiourea, and 6 mM in cadmium acetate, with a pH=9. The fused silica slides were removed from the bath after 20 minutes.

The samples were annealed in an oven with purging nitrogen gas (pressure=380 mm Hg) at 250° C. for 2 hours. Aluminum source and drain electrodes, measuring 500 microns in width, were evaporated onto the surface of the film. Each pair of electrodes comprised one device. There were 12 devices on each slide. Using an Agilent 4155 semiconductor parameter analyzer, the drain current was measured as the source-drain voltage was varied from 0–1 V. The samples were measured in the dark, since CdS is a photoconductor.

The sheet conductivity of sample 1, device 1, which had a channel length of 20 microns, was $2\times10^{-4}$ S/square. The sheet conductivity of sample 2, device 1, was $1.2\times10^{-5}$ S/square.

Example 1

The procedure described in Comparative Example 1 was repeated, except that gold foil (2"×4") was added to the beaker of deionized water, after the foil had been cleaned with dilute nitric acid, and rinsed with copious quantities of deionized water. For sample 1, device 1, the sheet conductivity was now $9.6\times10^{-7}$/square. For sample 2, device 1, the sheet conductivity was $3.2\times10^{-8}$ S/square.

The inclusion of gold in the bath decreased the conductivity by ~3 orders of magnitude.

Comparative Example 2

A stock solution of thiourea was made by adding deionized water to 2.009 gms of thiourea (Sigma Aldrich 99%) until the total weight was 100 gms. A stock solution of cadmium acetate (Sigma Aldrich 99%) was made by adding deionized water to 5.079 gms until the total weight was 100 gms.

Deionized water (212.76 gms) that had been heated to 65° C. was added to a Teflon PFA beaker. Two fused silica slides measuring 1"×2" (Heraeus Amersil) were cleaned by washing with acetone, methanol, and deionized water, then dried in a nitrogen stream. The slides were then cleaned in a plasma oven (Plasmapreen 973, North Brunswick, N.J.) at 300 W for 5 minutes. A slide was placed into a Teflon PFA beaker, followed sequentially by 1.007 gms of triethanolamine (Sigma Aldrich, 99%), 6.126 gms of the cadmium acetate stock solution, and then 5.107 gms of the thiourea stock solution. The resulting solution was 30 mM in triethanolamine, 6 mM in thiourea, and 6 mM in cadmium acetate, with a pH=9.5. The fused silica slides were removed from the bath after 20 minutes.

The samples were annealed in an oven with purging nitrogen gas at 250° C. for 2 hours. Aluminum source and drain electrodes, measuring 500 microns in width, were evaporated onto the surface of the film. Each pair of electrodes comprised one device. There were 12 devices on each slide. Using an Agilent 4155 semiconductor parameter analyzer, the drain current was measured as the source-drain voltage was varied from –1–1 V. The samples were measured in the dark, since CdS is a photoconductor.

For sample 1, device 12, the conductivity was $8.0\times10^{-2}$ S/cm. For sample 2, device 12, the conductivity was $5.5\times10^{-2}$ S/cm.

Example 2

The procedure of Comparative Example 2 was repeated, except that gold foil was placed in the beaker of deionized water before the addition of the stock solutions and TEA. The conductivity of substrate 1, device 12, which had a channel length of 100 microns, and a CdS thickness of 15 nm, was $7\times10^{-6}$ S/cm. The conductivity of substrate 2, device 12 was $4.3\times10^{-7}$ S/cm.

The inclusion of gold in the bath decreased the conductivity by ~4 orders of magnitude.

Example 3

A stock solution of thiourea was made by adding deionized water to 1.99 gms of thiourea (Sigma Aldrich 99%) until the total weight was 100 gms. A stock solution of cadmium acetate (Sigma Aldrich 99%) was made by adding deionized water to 5.08 gms until the total weight was 100 gms. A stock solution of ethylene diamine was made by adding deionized water to 5.12 gms of ethylene diamine until the total weight was 100 gms.

Deionized water (242 gms) that had been heated to 65° C. was added to a Teflon PFA beaker. A polycarbonate substrate, 1"×1"×1/16", was added to the bath. Then, a polymethylmethacrylate substrate, 1"×1"×1/16" was placed into a Teflon PFA beaker, followed sequentially by 2.16 gms of the ethylene diamine stock solution, 2.84 gms of the cadmium acetate stock solution, and then 2.38 gms of the thiourea stock solution. The resulting solution was 7.5 mM in triethanolamine, 2.5 mM in thiourea, and 2.5 mM in cadmium acetate, with a pH=10. A 2"×4" gold sheet was included in the bath. The substrates were removed from the bath after 70 minutes. The substrates were dried overnight on a 75° C. hotplate in air. The CdS film thickness was measured to be 100 nm.

Aluminum source and drain electrodes, measuring 500 microns in width, were evaporated onto the surface of the film. Each pair of electrodes comprised one device. There were 12 devices on each slide. Using an Agilent 4155 semiconductor parameter analyzer, the drain current was measured as the source-drain voltage was varied from –1 to +1 V. The samples were measured in the dark, since CdS is a photoconductor.

Device 12 of the polycarbonate sample gave a conductivity $\square=4\times10^{-6}$ S/cm. Device 12 of the polymethylmethacrylate sample gave a conductivity of $\square=3\times^{-8}$ S/cm after laminating the dielectric onto the deposited semiconductor.

What is claimed is:

1. A process for depositing a semiconductor film on a substrate, comprising:
   a) heating deionized water and the substrate in the presence of a noble metal in its elemental form;

b) adding sequentially an aqueous solution comprising a metal salt; a chelating agent; and an aqueous solution of source of a group VIa element; and c) allowing a semiconductor film to form on the substrate.

2. The process of claim 1, wherein the noble metal is gold.

3. The process of claim 1, wherein the substrate is selected from the group consisting of glass fused silica, spin-coated polyimide, polycarbonate, polyester and silicon wafers.

4. The process of claim 3, wherein the substrate is selected from the group of spin-coated polyimide, polycarbonate and polyester.

5. The process of claim 1, wherein the metal salt is selected from the group consisting of water-soluble formate, acetate sulfate and chloride salts of Cd, Hg, Ag, Mn, Bi, Sb, As Sn, In, Pb, Cu, Co, Ni, Mo, Fe and Cr.

6. The process of claim 1, wherein the metal salt is cadmium formate or cadmium acetate.

7. The process of claim 1, wherein the Group VIa element is S.

8. The process of claim 1, wherein the source of the Group Via element is thiourea or thioacetamide.

9. The process of claim 1, wherein the chelating agent is selected from the group consisting of ammonia, ethylenediamine, diethanolamine, triethanolamine, pyridine, aniline and aminophenols.

10. The process of claim 9, wherein the chelating agent is ethylenediamine or triethanolamine.

11. The process of claim 1, further comprising the steps of:

d) removing the substrate from the solution; and e) annealing the substrate.

* * * * *